United States Patent [19]

Yoder

[11] Patent Number: 4,756,794
[45] Date of Patent: Jul. 12, 1988

[54] ATOMIC LAYER ETCHING

[75] Inventor: Max N. Yoder, Falls Church, Va.

[73] Assignee: The United States of America as represented by the Secretary of the Navy, Washington, D.C.

[21] Appl. No.: 91,133

[22] Filed: Aug. 31, 1987

[51] Int. Cl.[4] .................... H01L 21/306; B44C 1/22
[52] U.S. Cl. .................................. 156/643; 156/646; 156/659.1; 156/662; 156/345; 204/192.35; 204/298; 252/79.1
[58] Field of Search ............. 156/640, 643, 646, 659.1, 156/662, 345; 134/1; 204/192.32, 192.34, 192.35, 298; 437/228; 252/79.1

[56] References Cited

U.S. PATENT DOCUMENTS 3,563,809  2/1971  Wilson ................. 156/643 U X
4,599,135  7/1986  Tsunekawa et al. ........... 156/643

Primary Examiner—William A. Powell
Attorney, Agent, or Firm—Thomas E. McDonnell; George Jameson

[57] ABSTRACT

An apparatus, and method therefor, for removing a single atomic layer from the surface of a crystalline diamond. In a preferred embodiment, the apparatus comprises: a first delivery system for flooding the surface of the diamond with a pulse of nitrogen dioxide during a first phase of operation to cause a monolayer of nitrogen oxide to be adsorbed to the surface of the diamond; and a second delivery system for impacting the surface of the diamond with a pulse of ions of mixed noble and hydrogen gasses during a second phase of operation in order to remove a single atomic layer from the surface of the diamond. In a preferred method for removing a single atomic layer from the surface of a crystalline diamond, the method comprises the steps of: flooding the diamond surface with a pulse of nitrogen dioxide during the first phase of operation; and impacting the diamond surface with a pulse of ions of mixed noble and hydrogen gasses during a second phase of operation in order to remove a single atomic layer from the surface of the diamond.

20 Claims, 2 Drawing Sheets

ATOMIC LAYER ETCHING

BACKGROUND OF THE INVENTION

The present invention relates to the patterned selective etching of semiconductor films and particularly to the single atomic layer etching of a crystalline diamond.

With the advent of epitaxial growth techniques, such as molecular beam epitaxy, metal organic chemical vapor epitaxy, and atomic layer epitaxy, the growth of very thin (even single atomic layer) epitaxial crystalline films has become a reality. Numerous new electronic device structures have been created which exploit the ability to grow very thin films of crystalline semiconductor material.

However, device processing of these ultra small, submicrometer scale devices also requires the patterned selective etching of these semiconductor films, but controlled etching processes have not kept pace with the above noted controlled growth processes. In the present state of such controlled etching processes, etching over a crystalline wafer area can be controlled only to within tens of atomic layers and is dependent upon doping uniformity and crystalline perfection.

OBJECTS OF THE INVENTION

One object of the invention is to provide a method for uniformly removing a single atomic layer of crystalline diamond from a diamond surface.

Another object of the invention is to provide a method for uniformly removing any preselected number of atomic layers from a crystalline diamond surface.

Another object of the invention is to provide a method for etching or removing any preselected number of atomic layers from a crystalline diamond surface, that was initially masked off according to a preselected pattern, in order to obtain in the diamond surface an etched pattern of a predetermined depth, which etched pattern conforms to the preselected pattern.

A further object of the invention is to provide an apparatus which selectively causes the uniform removal of any preselected number of atomic layers from a crystalline diamond surface.

SUMMARY OF THE INVENTION

These and other objects of this invention are achieved by providing an apparatus and associated method for removing a single atomic layer from the surface of a crystalline diamond by flooding the diamond surface with a pulse of nitrogen dioxide during a first phase of operation and then impacting the diamond surface with a pulse of ions of mixed noble and hydrogen gasses during a second phase of operation in order to remove the single atomic layer from the surface of the diamond.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein.

DETAILED DESCRIPTION OF THE PREFERRED EMBODIMENT

Figure 1:
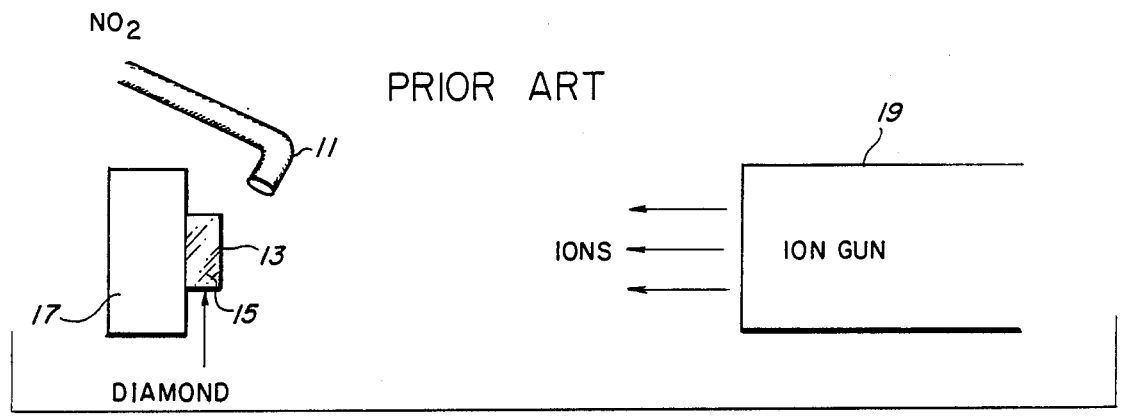
FIG. 1 is a schematic diagram of a prior art technique for etching a crystalline diamond.

Referring now to FIG. 1, a schematic diagram of a prior art technique for etching a crystalline diamond is shown. Nitrogen dioxide gas ($NO_2$) from an $NO_2$ source (not shown) is passed through a jet 11 to continuously flood the surface 13 to be etched of a crystalline diamond 15 that is mounted to a holder 17. This causes a layer of nitrogen dioxide to be adsorbed on the surface 13. Since nitrogen dioxide readily adheres to the crystalline diamond 15 but not to itself, only one layer of nitrogen dioxide will be adsorbed on the diamond surface 13 at any given time.

Simultaneously, energetic ions from an ion gun 19 bombard the surface 13. This bombardment of the surface 13, to which a layer of nitrogen dioxide is adsorbed, causes the adsorbed nitrogen dioxide ($NO_2$) to decompose into its atomic constituents of nitrogen (N) and oxygen (O) atoms. The oxygen atoms attach themselves to the carbon atoms on the diamond surface 13 to form carbon monoxide (CO) and carbon dioxide ($CO_2$). (It should be recalled that a diamond is formed from carbon when carbon is subjected to very high pressures and very high temperatures.) The nitrogen (N) atoms also combine into inert $N_2$ molecules. In addition, an exothermic process results, wherein the $N_2$, CO and $CO_2$ gasses vacate the diamond surface 13.

Due to the continuous flooding of $NO_2$ on the surface 13 and to the continuous ion bombardment of that surface 13, the above described operation continuously repeats. As a result, the surface 13 of the diamond 15 is rapidly eroded as the nitrogen dioxide applied to the surface 13 is being steadily replenished in the presence of the bombarding ions.

Figure 2:
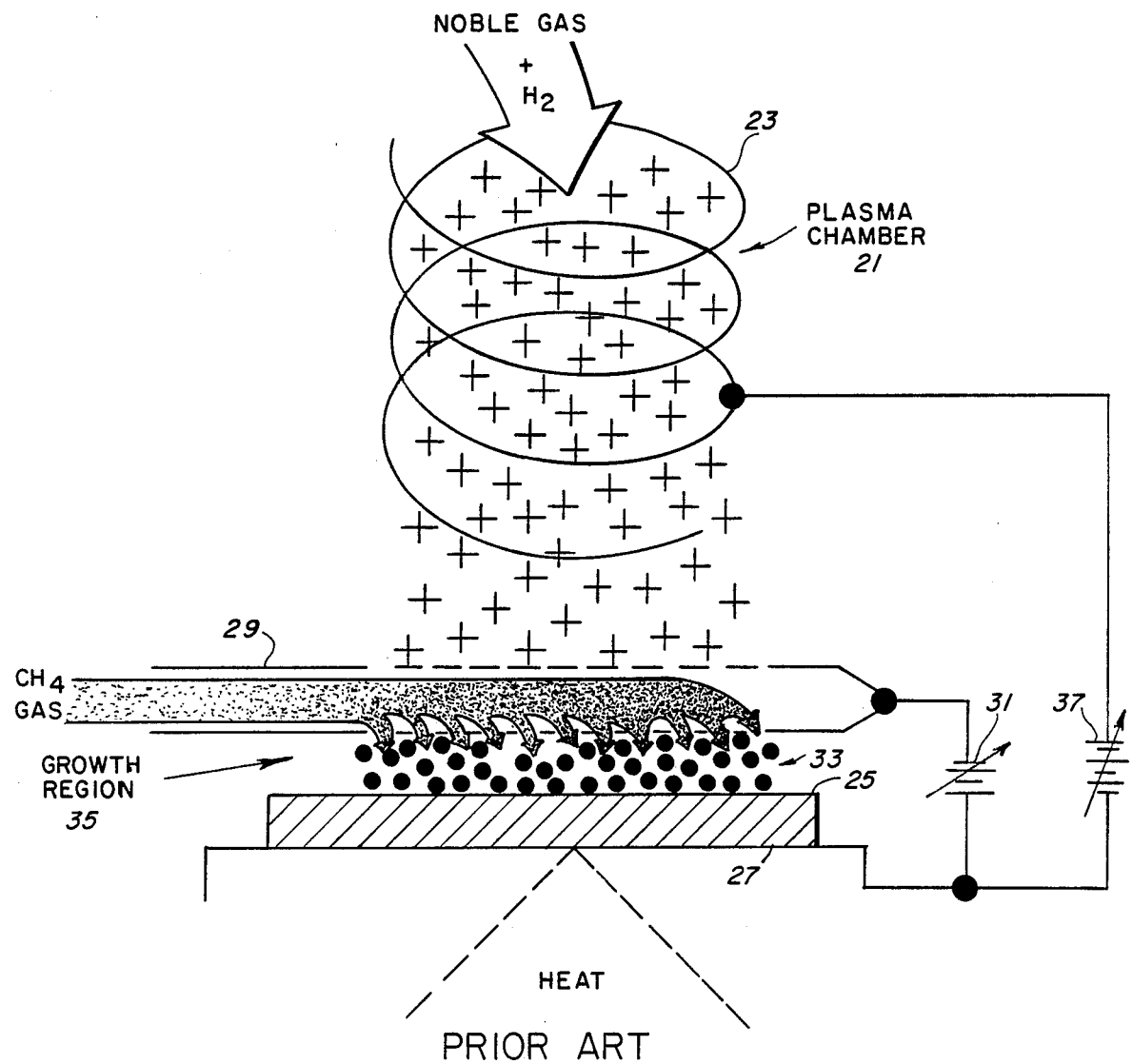
FIG. 2 is a schematic diagram of a prior art technique for the epitaxial growth of semiconducting films on a substrate.

Another prior art technique is shown in FIG. 2. More specifically, FIG. 2 is a schematic diagram of a prior art technique for the epitaxial growth of semiconducting films on a substrate at temperatures much lower than those usable by other known prior art means.

As shown in FIG. 2, a mixture of noble gas and hydrogen gas is passed from a source (not shown) into a plasma chamber 21 surrounded by a helical coil 23. The combination of the plasma chamber 21 and helical coil 23 is representative of a Kauffman ion gun. A radio frequency (RF) source (not shown) excites the coil 23, causing the noble and hydrogen gasses in the chamber 21 to become excited ions and excited metastable monomers, which drift toward a heated substrate 25 disposed on a substrate holder platform 27.

Located between the plasma chamber 21 and the substrate 25 is a grid-like gas ring 29 which performs several important functions. First, the gas ring 29, which is negatively charged with respect to the substrate holder platform 27 by a battery 31, neutralizes the excited ions. The substrate 25 is maintained positive with respect to the gas ring 29 so that any positive ions are repelled. This only leaves the excited metastable neutral monomers of the noble and hydrogen gasses to continue drifting to the heated substrate 25. Second, the gas ring 29 provides a path to flood the substrate 25 with a reactant-bearing gas necessary to affect crystalline growth. The source of this reactant-bearing gas is not shown. For the growth of diamond (crystalline carbon) films, the reactant-bearing gas is typically methane ($CH_4$).

The excited noble and hydrogen gas monomers decompose the methane gas into its atomic constituents of carbon (C) and hydrogen ($2H_2$) gas, with the crystalline carbon becoming adsorbed on the surface of the substrate 25 as crystalline diamond layers 33 in a growth region 35. The excited noble and hydrogen gas monomers also provide energy to desorb any impurities bound to the growing surface, and also enhance the surface migration velocity of the growing diamond film so as to enhance crystalline perfection.

A second battery 37 is connected between the coil 21 and the substrate holder platform 27. With the batteries 31 and 37 connected as shown, the plasma chamber 21 is positive with respect to the gas ring 29, while the gas ring 29 is negative with respective to the substrate 25. The potentials of the batteries 31 and 37 are adjusted so as to preclude a current flow into or out of the substrate 25. As a result, the batteries 31 and 37 operate to repel ions away from the substrate 27, so that only the highly excited metastable neutral monomers of noble and hydrogen gasses reach the surface 25 of the substrate 27.

Figure 3:
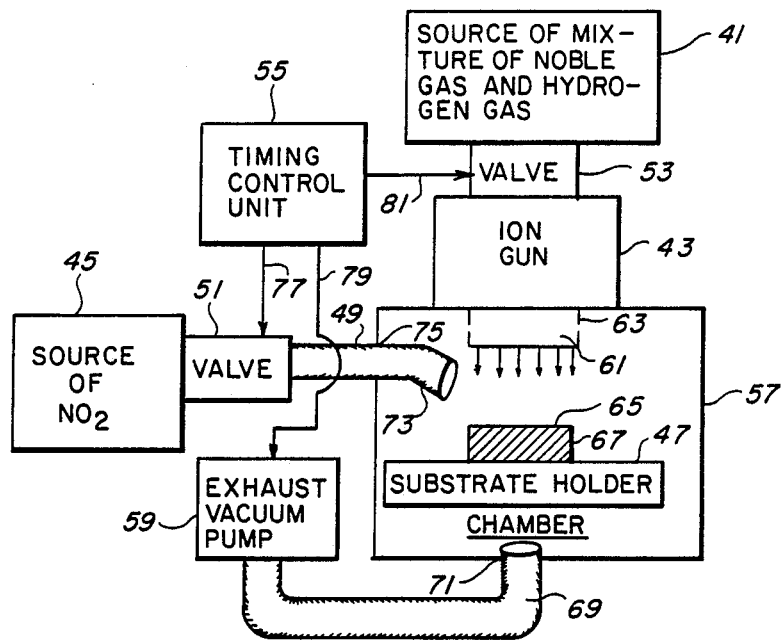
FIG. 3 is a schematic block diagram of the invention.

Referring now to FIG. 3, a schematic block diagram of an apparatus which embodies the invention is shown. The apparatus of FIG. 3 utilizes a source 41 of a mixture of noble and hydrogen gasses, an ion gun 43, a source 45 of nitrogen dioxide, a substrate holder 47 and a gas directing device 49, similar to those corresponding structural components shown or suggested in the prior art apparatuses of FIGS. 1 and 2. However, additional and unobvious components must be added to the above-named structural components found in the prior art apparatuses of FIGS. 1 and 2 in order to obtain an apparatus which can controllably etch away exactly one atomic layer from the surface of a crystalline diamond for each cycle of operation. More specifically, these additional and unobvious components include solenoid valves 51 and 53, a timing control unit 55, a sealed or enclosed chamber 57 and an exhaust vacuum pump 59.

A lower portion 61 of the ion gun 43 is mounted through an upper orifice 63 in the top of the chamber 57 to point downward toward the surface 65 of a crystalline diamond 67 mounted to the substrate holder 47. Both the diamond 67 and substrate holder 47 are also contained within the chamber 57. A hose 69 of the exhaust vacuum pump 59 is mounted into the chamber 57 by way of a lower orifice 71 in the bottom of the chamber 57 to enable the pump 59 to selectively remove any gasses in the chamber 57. The gas directing device 49, which may be a gas jet or a gas ring, for example, is connected to the valve 51 at one end. The free end 73 of the gas directing device 49 is mounted through a side orifice 75 in the chamber 57 to point toward the surface 65 of the diamond 67.

Each cycle of operation of the apparatus of FIG. 3 has four phases of operation. In a first phase of operation, the timing control unit 55 sends a signal over a line 77 to enable the solenoid valve 51 to open for a preselected period of time of, for example, ½ of a second. During this exemplary ½ second period of time, a pulse of nitrogen dioxide ($NO_2$) is passed from the $NO_2$ source 45 through the open valve 51 and the gas directing device 49 into the chamber 57 to flood the diamond surface 65. This flooding operation causes a monolayer (single layer) of nitrogen dioxide to be adsorbed on the diamond surface 65. Since nitrogen dioxide readily adheres to the crystalline diamond 67 but not to itself, only one layer of nitrogen dioxide will be adsorbed on the diamond surface 65 during this ½ second $NO_2$ flooding period.

At the end of this exemplary ½ second $NO_2$ flooding period, the timing control unit 55 terminates the signal on line 77 to close the valve 51, thereby preventing the $NO_2$ from flowing through the valve 51. At the same time that the signal on line 77 is terminated, the timing control unit 55 sends a signal on line 79 to enable the exhaust vacuum pump 59 to purge the chamber 57 of any nitrogen dioxide gas. This $NO_2$ purging operation continues for an exemplary ½ second period of time.

At the end of this exemplary ½ second long $NO_2$ purging operation, the timing control unit 55 terminates the signal on line 79 to stop any further purging of the chamber 57. At the same time that the signal on line 79 is terminated, the timing control unit 55 sends a signal on line 81 to enable the solenoid valve 53 to open for an exemplary 1 second period of time. During this 1 second period of time, a pulse of a mixture of noble and hydrogen gasses is passed from the source 41 through the open valve 43 into the ion gun 43. This ion gun 43 ionizes the pulse of mixed noble and hydrogen gasses, causing energetic ions to bombard the diamond surface 65.

This ion bombardment of the surface 65 causes the previously adsorbed nitrogen dioxide ($NO_2$) to decompose into its atomic constituents of nitrogen (N) and oxygen (O) atoms. The oxygen atoms attach themselves to the carbon atoms on the diamond surface 65 to form carbon monoxide (CO) and carbon dioxide ($CO_2$). The nitrogen atoms in the adsorbed $NO_2$ also combine into $N_2$ molecules. An exothermic process results, wherein the $N_2$, CO and $CO_2$ gasses vacate the diamond surface 65.

At the end of this exemplary 1 second long ion bombardment of the surface 65, the timing control unit 55 terminates the signal on line 81 to close valve 53, and also sends another signal on line 79 to enable the exhaust vacuum pump 59 to purge the chamber 57 of any ions or gasses present, such as $N_2$, CO and $CO_2$. This second purging operation continues for an exemplary ½ second period of time, at which time the timing control unit 55 terminates the signal on line 79 to complete one cycle of operation.

It should be mentioned at this time that the exhaust vacuum pump 59 has two operational modes. During the time that the exhaust vacuum pump 59 is purging the chamber 57 of any nitrogen dioxide gas during the second phase and of any ions or $N_2$, CO and $CO_2$ gasses during the fourth phase, the exhaust vacuum pump 59 is operated by the signal over the line 79 (from the timing control unit 55) to produce approximately 1 milli Torr of pressure in the chamber 57. Conversely, when no signal is present on the line 79 during the time that either of the valves 51 and 53 is open to release its associated gas (or gasses) during the first and third phases of operation, the exhaust vacuum pump 59 reverts to a quiescent operation so that there is not more than 100 milli Torr of pressure in the chamber 57.

It is important to note that the nitrogen gas and the mixture of noble and hydrogen gasses are each pulses of gas and that these pulses of gas are not simultaneously applied. As a result, exactly one atomic layer of the diamond 67 is etched away per cycle. In this manner the etching depth is precisely controlled by the number of cycles while the etch rate is controlled by the frequency of the cycles and the temperature of the diamond surface 65.

Figure 4:
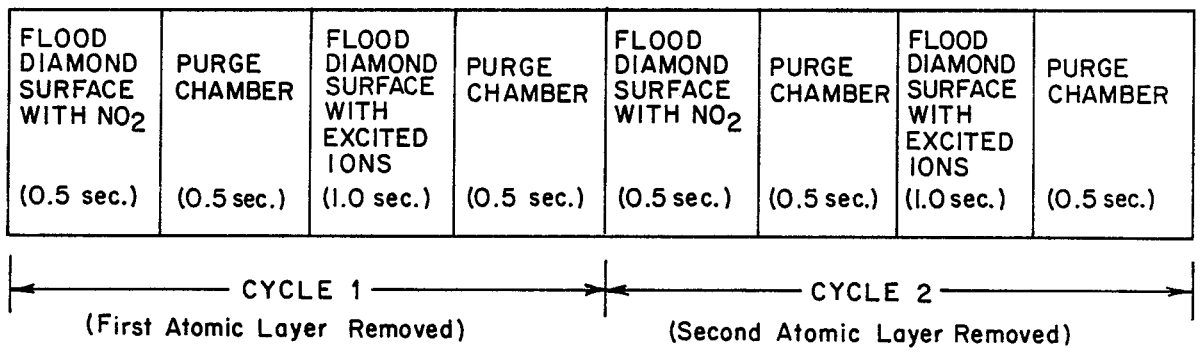
FIG. 4 is a timing diagram useful in understanding the operation of the invention of FIG. 3.

FIG. 4 is a timing diagram which illustrates two cycles of operation for uniformly removing exactly two atomic layers from the diamond surface 65 of FIG. 3. Each cycle of operation is the same as the next cycle of operation.

The timing control unit 55 of FIG. 3 can be a computer or a microprocessor which is programmed to selectively generate signals on the lines 77, 79 and 81 to remove a preselected number of atomic layers from the diamond surface 65. In an alternate embodiment, the timing control unit 55 can be replaced by a person, who manually opens and closes the values 51 and 53 and manually turns off and on the exhaust vacuum pump 59 according to a preselected sequence and timing schedule to etch away any preselected number of atom layers from the diamond surface 65.

The surface 65 of the diamond 67 to be etched can be masked or patterned with a preselected pattern prior to etching so that each single atomic layer subsequently removed from the diamond surface 67 conforms to the preselected pattern. Of course, the material used for such masking and patterning must be such that it is unaffected by nitrogen dioxide. Such a material may be, for example, $Si_3N_4$.

In some cases it may be desirable to clean the diamond surface 65 before initiating the first cycle of operation. In such a cleaning operation, the timing control unit 55 sends a signal on line 81 for about 15 seconds or longer to cause at ion bombardment of the diamond surface 65 for that duration of time. This ion bombardment of the surface 65, to which no monolayer of $NO_2$ has been adsorbed, cleans the diamond surface 65. After that ion bombardment period, the timing control unit 55 turns off the signal on line 81 and turns on the signal on line 79 to purge the chamber 57 of any ion or gasses for an exemplary ½ second. At the end of this purging operation, no signal would be present on any of the lines 77, 79 and 81, until a cycle of operation was initiated, as discussed before.

Therefore, what has been described is an apparatus and associated method for uniformly removing a single atomic layer from the surface of a crystalline diamond by flooding the diamond surface with a pulse of nitrogen dioxide during one phase of operation and then impacting the diamond surface with a pulse of ions of mixed noble and hydrogen gasses during another phase of operation in order to uniformly remove the single atomic layer from the diamond surface.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by Letters Patent of the United States is:

1. A method for removing a single atomic layer from the surface of a crystalline diamond, said method comprising the steps of:
   flooding the diamond surface with a pulse of nitrogen dioxide during a first phase of operation; and
   impacting the diamond surface with a pulse of ions of mixed noble and hydrogen gasses during a second phase of operation.

2. The method of claim 1 wherein said flooding step comprises the steps of:
   producing the pulse of nitrogen dioxide during the first phase of operation; and
   directing the pulse of nitrogen dioxide onto the diamond surface.

3. The method of claim 1 wherein said impacting step includes the steps of:
   producing a pulse of mixed noble and hydrogen gasses during the second phase of operation; and
   ionizing the pulse of mixed noble and hydrogen gasses to cause a pulse of ions of said mixed gasses to impact the diamond surface.

4. The method of claim 1 wherein:
   said flooding step comprises the steps of: producing the pulse of nitrogen dioxide during the first phase of operation, and directing the pulse of nitrogen dioxide onto the diamond surface; and
   said inpacting step includes the steps of: producing a pulse of mixed noble and hydrogen gasses during the second phase of operation, and ionizing the pulse of mixed noble and hydrogen gasses to cause a pulse of ions of said mixed gasses to inpact the diamond surface to remove the single atomic layer from the diamond surface.

5. A method for removing a preselected number of single atomic layers from the surface of a crystalline diamond, said method comprising the steps of:
   flooding the diamond surface with a pulse of nitrogen dioxide during a first phase of operation;
   impacting the diamond surface with a pulse of ions of mixed noble and hydrogen gasses during a second phase of operation to remove a single atomic layer from the surface of the diamond; and
   repeating both of the flooding and impacting steps each time that an additional atomic layer is to be removed from the surface of the diamond.

6. The method of claim 5 wherein said flooding step comprises the steps of:
   producing the pulse of nitrogen dioxide during the first phase of operation; and
   directing the pulse of nitrogen dioxide onto the diamond surface.

7. The method of claim 5 wherein said impacting step includes the steps of:
   producing a pulse of mixed noble and hydrogen gasses during the second phase of operation; and
   ionizing the pulse of mixed noble and hydrogen gasses to cause a pulse of ions of said mixed gasses to impact the diamond surface.

8. The method of claim 6 wherein said impacting step includes the steps of:
   producing a pulse of mixed noble and hydrogen gasses during the second phase of operation; and
   ionizing the pulse of mixed noble and hydrogen gasses to cause a pulse of ions of said mixed gasses to impact the diamond surface.

9. A method for removing at least one single atomic layer from the surface of a crystalline diamond, said method comprising the steps of:
   masking the surface of the diamond with a material having a preselected pattern and being unaffected by nitrogen dioxide;
   flooding the preselected pattern with a pulse of nitrogen dioxide during a first phase of operation;
   impacting the diamond surface with a pulse of ions of mixed noble and hydrogen gasses during a second phase of operation to etch out from the surface of the diamond a single atomic layer conforming to said preselected pattern; and repeating both of the flooding and impacting steps for each additional atomic layer to be removed from the surface of the diamond.

10. A method for removing at least one single atomic layer from the surface of a crystalline diamond, said method comprising the steps of:
(a) flooding the diamond surface with a pulse of nitrogen dioxide gas to cause a monolayer of nitrogen dioxide to be adsorbed to the diamond surface during a first phase of operation;
(b) purging the nitrogen dioxide gas from the space around the diamond;
(c) impacting the diamond surface with a pulse of ions of mixed noble and hydrogen gasses during a second phase of operation to remove a single atomic layer from the surface of the diamond; and
(d) purging the space about the diamond of any ions and gasses.

11. The method of claim 10 further including the step of:
repeating steps (a) through (d) for each additional atomic layer to be removed from the surface of the diamond.

12. The method of claim 10 further including before step (a) the further steps of:
cleaning the diamond surface by impacting it with a pulse of ions of mixed noble and hydrogen gasses; and
purging the space about the diamond of any ions and gasses.

13. The method of claim 12 further including the step of:
repeating steps (a) through (d) for each additional atomic layer to be removed from the surface of the diamond.

14. The method of claim 13 further including between the purging the space step and step (a) the further step of:
masking the surface of the diamond with a material having a preselected pattern and being unaffected by nitrogen dioxide; and wherein said impacting step includes the step of:
conforming each removed single atomic layer to the preselected pattern.

15. An apparatus for removing at least one single atomic layer from the surface of a crystalline diamond, said apparatus comprising:
means for flooding the surface of the crystalline diamond with a pulse of nitrogen dioxide during a first phase of operation; and
means for impacting the diamond surface with a pulse of ions of mixed noble and hydrogen gasses during a second phase of operation to remove a single atomic layer from the surface of the diamond.

16. The apparatus of claim 15 wherein said impacting means comprises:
a source for producing a pulse of mixed noble and hydrogen gasses during the second phase of operation; and
means responsive to the pulse of mixed noble and hydrogen gasses for causing a pulse of ions of said mixed gasses to impact the diamond surface.

17. The apparatus of claim 15 wherein said flooding means comprises:
first source means for producing a pulse of nitrogen dioxide during the first phase of operation; and
means for directing the pulse of nitrogen dioxide onto the surface of the diamond.

18. The apparatus of claim 17 wherein said impacting means comprises:
second source means for producing a pulse of mixed noble and hydrogen gasses during the second phase of operation; and
means for outputting the pulse of ions of said mixed noble and hydrogen gasses to impact the diamond surface in response to said pulse of mixed noble and hydrogen gasses.

19. An apparatus for removing at least one single atomic layer from the surface of a crystalline diamond, said apparatus comprising:
a chamber for holding the crystalline diamond;
a timing control unit for selectively generating a plurality of signals;
a first delivery system comprised of a first source of nitrogen dioxide, a gas directing device inserted into said chamber, and a first valve coupled between said first source and said gas directing device, said first valve being responsive to a first signal from said timing control unit for enabling a pulse of nitrogen dioxide from said first source to pass through said gas directing device to flood the surface of said diamond and cause a monolayer of nitrogen dioxide to be adsorbed to the diamond surface during a first phase of operation;
an exhaust vacuum pump coupled to said chamber and being responsive to a second signal from said timing control unit for purging the nitrogen dioxide from said chamber during a second phase of operation; and
a second delivery system comprised of a second source of mixed noble and hydrogen gasses, an ion gun inserted into said chamber, and a second valve coupled between said second source and said ion gun, said second valve being responsive to a third signal from said timing control unit for enabling a pulse of mixed noble and hydrogen gasses from said second source to pass into said ion gun, said ion gun being responsive to the pulse of mixed noble and hydrogen gasses for causing a pulse of ions of said mixed noble and hydrogen gasses to impact the diamond surface during a third phase of operation to remove a single atomic layer from the surface of the diamond;
said exhaust vacuum pump being responsive to a fourth signal from said timing control unit for purging said chamber of any ions and gasses.

20. The apparatus of claim 19 further including a mask having a preselected pattern being initially deposited on the surface of the diamond so that each single atomic layer subsequently removed from the surface of the diamond conforms to the preselected pattern.

* * * * *